United States Patent
Woo et al.

(10) Patent No.: US 8,466,604 B2
(45) Date of Patent: Jun. 18, 2013

(54) VIBRATION ACTUATOR MODULE HAVING SMALLER ELASTIC MODULUS THAN VIBRATED BODY

(75) Inventors: Ki-Suk Woo, Seoul (KR); Yeon-Ho Son, Hwasung-si (KR); Su-Young Jung, Yongin-si (KR); Dong-Sun Park, Seoul (KR); Dae-Woong Yun, Incheon (KR); Kum-Kyung Lee, Ansan-si (KR); Ji-Yeoun Jang, Suwon-si (KR); Jae-Kyung Kim, Ansan-si (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 501 days.

(21) Appl. No.: 12/773,352

(22) Filed: May 4, 2010

(65) Prior Publication Data

US 2011/0127884 A1  Jun. 2, 2011

(30) Foreign Application Priority Data

Nov. 27, 2009  (KR) .................. 10-2009-0116182

(51) Int. Cl.
*H01L 41/08*  (2006.01)
(52) U.S. Cl.
USPC ...................... 310/328; 310/324; 310/348
(58) Field of Classification Search
USPC .................................. 310/324, 328
See application file for complete search history.

(56) References Cited

U.S. PATENT DOCUMENTS

| | | | | |
|---|---|---|---|---|
| 3,721,840 A | * | 3/1973 | Yamada | 310/334 |
| 6,789,642 B1 | * | 9/2004 | Long et al. | 181/149 |
| 7,565,949 B2 | * | 7/2009 | Tojo | 181/199 |
| 7,701,119 B2 | * | 4/2010 | Onishi et al. | 310/328 |
| 7,903,201 B2 | * | 3/2011 | Cho et al. | 349/67 |
| 8,148,876 B2 | * | 4/2012 | Onishi et al. | 310/324 |
| 2001/0026625 A1 | * | 10/2001 | Azima et al. | 381/152 |
| 2010/0219722 A1 | * | 9/2010 | Onishi et al. | 310/348 |
| 2010/0246863 A1 | * | 9/2010 | Onishi et al. | 381/190 |
| 2010/0315355 A1 | * | 12/2010 | Kim et al. | 345/173 |
| 2011/0002485 A1 | * | 1/2011 | Onishi et al. | 381/190 |

FOREIGN PATENT DOCUMENTS

| | | | |
|---|---|---|---|
| JP | 2001017917 A | * | 1/2001 |
| JP | 2007-300426 | | 11/2007 |

OTHER PUBLICATIONS

Korean Office Action issued in Korean Patent Application No. 10-2009-0116182, mailed Feb. 18, 2011.

\* cited by examiner

*Primary Examiner* — J. San Martin
(74) *Attorney, Agent, or Firm* — McDermott Will & Emery LLP

(57) ABSTRACT

A vibration actuator module is disclosed. In accordance with an embodiment of the present invention, the vibration actuator module includes a vibrated body, a vibrating plate, which is coupled to the vibrated body and has a smaller elastic modulus than the vibrated body, and a driver, which is coupled to the vibrating plate.

8 Claims, 9 Drawing Sheets

VIBRATION ACTUATOR MODULE HAVING SMALLER ELASTIC MODULUS THAN VIBRATED BODY

CROSS-REFERENCE TO RELATED APPLICATIONS

This application claims the benefit of Korean Patent Application No. 10-2009-0116182, filed with the Korean Intellectual Property Office on Nov. 27, 2009, the disclosure of which is incorporated herein by reference in its entirety.

BACKGROUND

1. Technical Field

The present invention is related to a vibration actuator module.

2. Description of the Related Art

A touchscreen panel is a kind of input device through which a user may press a particular area with a finger or a stylus pen to enter an input. The touchscreen panel may transfer an input signal corresponding to the pressed position to an electronic device on which the touchscreen panel is equipped.

Developed recently to make the electronic device, such as a mobile phone, etc., provide a better appealing sensory feel to the user are devices that are capable of providing feedback in the form of vibration in response to the user's maneuvering of the touchscreen panel.

In such devices, the user may press a particular position on the touchscreen panel, and then the feedback in the form of vibration may be transferred to the user. In this case, however, a large capacity driver is required to provide a greater feedback to the user.

However, mobile electronic devices may be limited in increasing the size, and their battery capacities are also limited. Due to such difficulties, providing a better appealing sensory feel to the user has been inevitably restricted.

SUMMARY

The present invention provides a vibration actuator module with an improved vibration efficiency.

An aspect of the present invention provides a vibration actuator module that includes a vibrated body, a vibrating plate, which is coupled to the vibrated body and has a smaller elastic modulus than the vibrated body, and a driver, which is coupled to the vibrating plate.

The vibrated body can be a display panel. The vibrated body can include a display panel and a frame, which supports the display panel. The frame can include stainless steel, and the vibrating plate can include polycarbonate.

The vibrating plate can be interposed between the frame and the driver, and the driver can include a piezoelectric component, which is extended and contracted in a lengthwise direction. An opening can be formed in a center of the vibrating plate, and the piezoelectric component can be coupled to both sides of the opening of the vibrating plate.

Additional aspects and advantages of the present invention will be set forth in part in the description which follows, and in part will be obvious from the description, or may be learned by practice of the invention.

DETAILED DESCRIPTION

Figure 1:
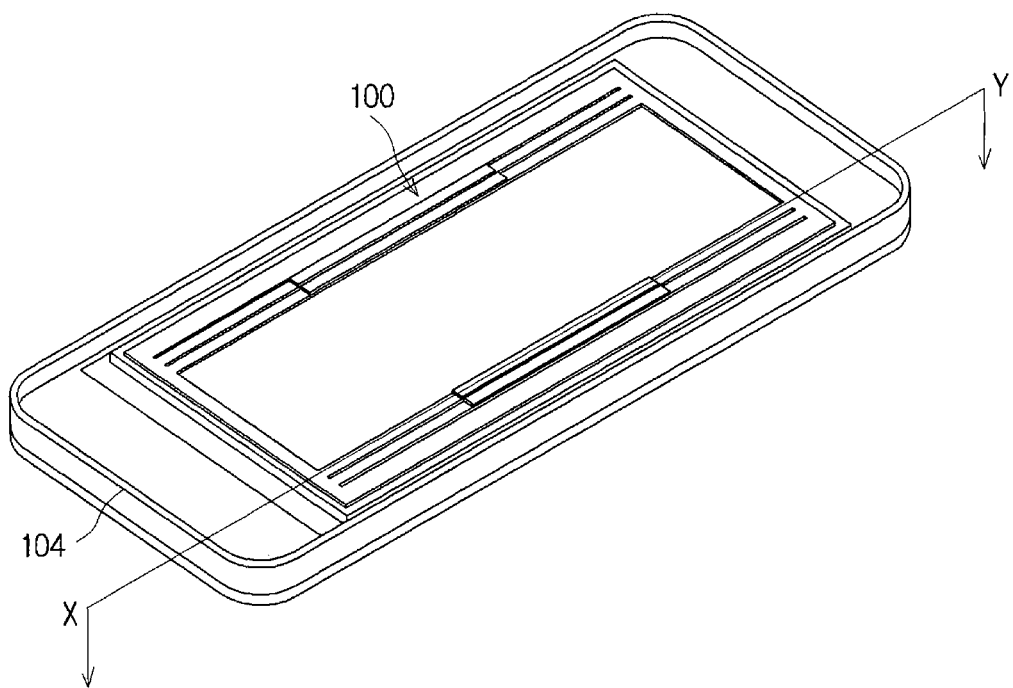
FIG. 1 is a perspective view of a touch interface assembly in accordance with an embodiment of the present invention.

The features and advantages of this invention will become apparent through the below drawings and description.

A vibration actuator module according to certain embodiments of the present invention will be described below in more detail with reference to the accompanying drawings. Those components that are the same or are in correspondence are rendered the same reference numeral regardless of the figure number, and redundant descriptions are omitted.

A vibration actuator module is a device for providing a feedback by vibrations and can include a part that generates vibration, a part that transfers the vibration and a part that supports a vibrated body.

The vibration actuator module can be a component module that is coupled to, for example, a rear surface of a display panel of a mobile phone and provides vibrations to the user through a touchscreen panel coupled to a front surface of the display panel.

Figure 2:
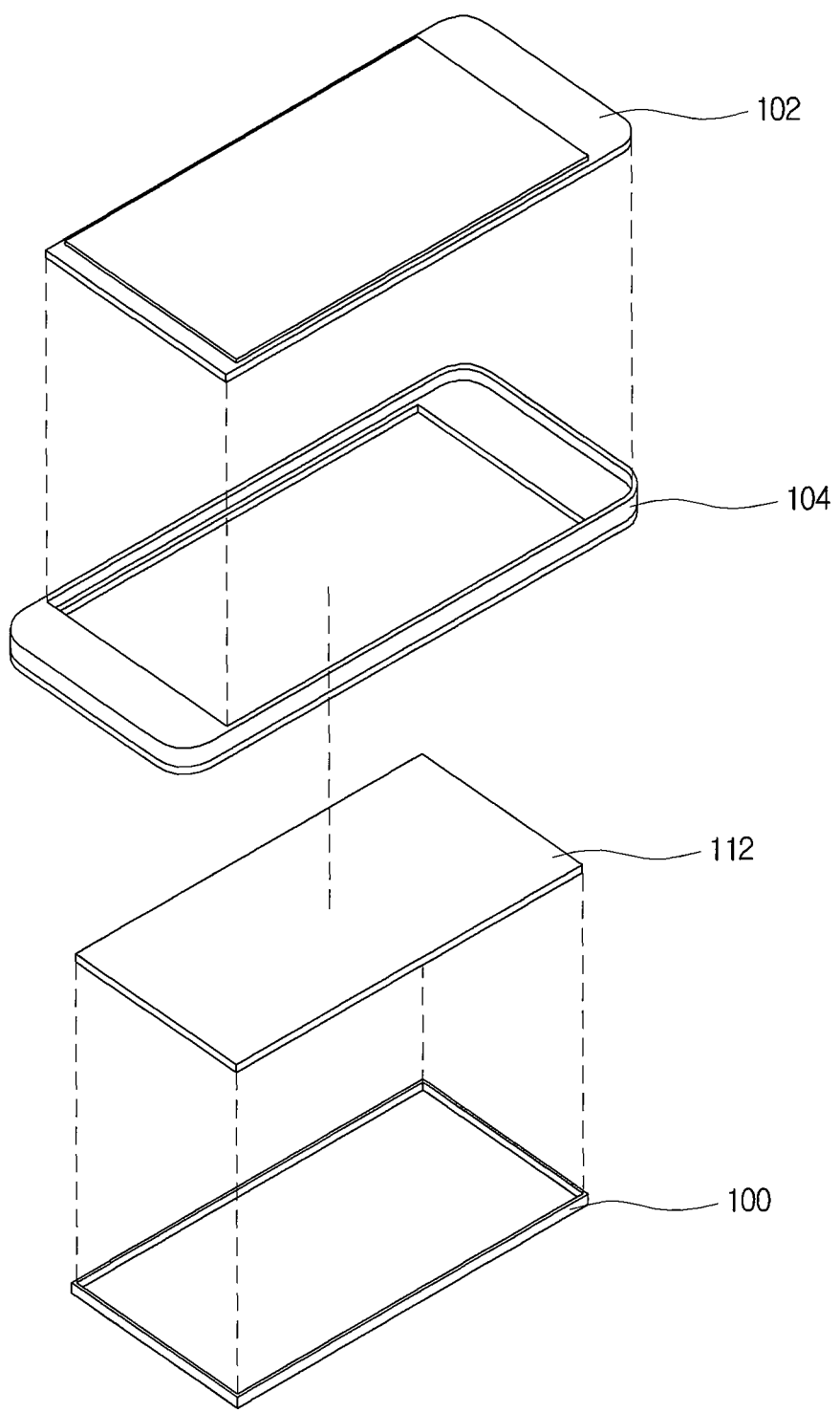
FIG. 2 is an exploded perspective view of a touch interface assembly in accordance with an embodiment of the present invention.
Figure 3:
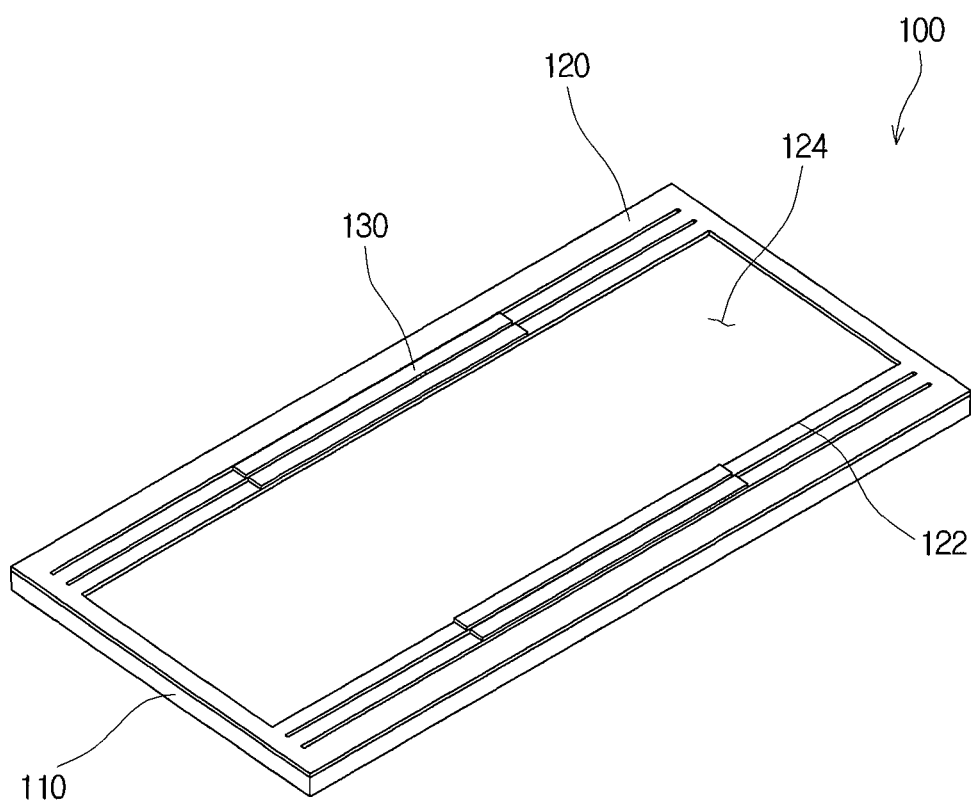
FIG. 3 is a perspective view of a vibration actuator module in accordance with an embodiment of the present invention.

FIG. 1 is a perspective view of a touch interface assembly in accordance with an embodiment of the present invention, and FIG. 2 is an exploded perspective view of a touch interface assembly in accordance with an embodiment of the present invention. FIG. 3 is a perspective view of a vibration actuator module in accordance with an embodiment of the present invention.

As illustrated in FIGS. 1 to 3, the touch interface assembly in accordance with an embodiment of the present invention can include a touchscreen panel 102, a case 104, a display panel 112 and a vibration actuator module 100.

The touch interface assembly can refer to a device that can have information inputted by a user through the touchscreen panel 102, provide information to the user through the display panel 112 and provide a feedback or sensory feel in the form of vibration to the user through the vibration actuator module 100, by being mounted on an electronic device, for example, a mobile phone, that is capable of inputting/outputting information.

The touchscreen panel 102 can be coupled to an upper surface of the case 104 and have information inputted through the touch of the user. The case 104 becomes an upper portion of the electronic device and can support the components of the touch interface assembly.

The display panel 112 can be coupled to a rear surface of the touchscreen panel 102 and provide information in the form of an image to the user. The vibration actuator module 100 can be coupled to a rear surface of the display panel 112.

The vibration actuator module 100 in accordance with an embodiment of the present invention can include the display panel 112, a frame 110, a vibrating plate 120 and a driver 130.

The frame 110 can support the display panel 112. The frame 110 can be formed in the shape of a plate, in which the display panel 112 is mounted in the center, to support the display panel 112.

Since the frame 110 supports circumferential sides of the display panel 112, the display panel 112 can be supported more stably. Since the frame 110 should be able to support the display panel 112 from external shocks, a rigid material, for example, a material including stainless steel, can be used as the frame 110.

A vibrated body can refer to a part that is vibrated by the operation of the driver 130 and can include, for example, the frame 110 and the display panel 112, which is supported by the frame 110.

The vibrating plate 120 can be coupled to a rear surface of the frame 110. The vibrating plate 120 can be formed in the shape of a plate, in which an opening 124 is formed in the center. A vibrating bar 122 extended lengthwise can be formed on both sides of the opening 124.

The vibrating bar 122 can be provided as a plurality of vibrating bars, and two vibrating bars 122 can be coupled on each of both sides of the frame 110. The vibrating plate 120 can support a piezoelectric component, which will be described later, and the piezoelectric component can be coupled on each vibrating bar 122.

The vibrating plate 120 can transfer vibrations generated by the piezoelectric component to the frame 110 and have the opening 124 formed in the center so that an area of the vibrating plate 120 excluding the area (that is, the vibrating bar 122), interposed between the piezoelectric component and the frame 110, can be minimized. Accordingly, when the piezoelectric component vibrates, an unnecessary load that may be applied to the piezoelectric component can be minimized.

Here, the load can refer to deformation resistance (that is, unnecessary stiffness) that may be applied to the piezoelectric component when the piezoelectric component deforms.

Figure 4:
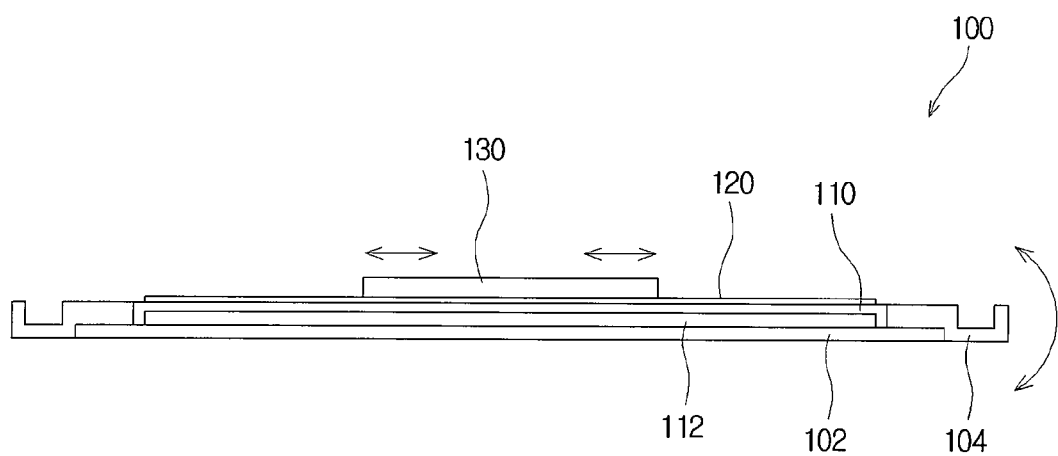
FIG. 4 is a transverse section X-Y of FIG. 1.

FIG. 4 is a transverse section X-Y of FIG. 1. As illustrated in FIG. 4, the vibrating plate 120 can be interposed between the driver 130 and the frame 110. Accordingly, the vibrating plate 120 can separate the driver 130, which generates vibrations by deformation, and the display panel 112, which is the vibrated body, from each other by as much as the thickness of the vibrating plate 120.

Therefore, the vibrating plate 120 can separate the driver 130 farther from the neutral axis of a structure in which the driver 130, the vibrating plate 120 and the display panel 112 are coupled to one another, allowing the driver 130 to easily deform the display panel 112.

By allowing the driver 130 to deform the display panel 112 more easily, the vibrating plate 120 can more efficiently transfer vibrations generated by the driver 130 to the display panel 112.

The vibrating plate 120 can be made of a material that has a smaller elastic modulus than the frame 110. The vibrating plate 120 can transfer the deformational behavior of the driver 130 to the frame 110 and minimize the resistance against the deformation applied to the piezoelectric component by using a material having a smaller elastic modulus.

Here, the frame 110 can support the display panel 112 and thus is required to have a specific stiffness in order to protect the display panel 112. Accordingly, the vibrating plate 120 can more efficiently transfer vibrations generated by the driver 130 to the frame 110 by using a material having a smaller elastic modulus than the frame 110.

The vibrating plate 120 can be made of a material, for example, brass, aluminum or polycarbonate of polymer series, that has a smaller elastic modulus than the stainless steel described above. Here, the driver 130, which will be described later, can include a piezoelectric component, and the vibrating plate 120 can be made of an insulation material, for example, polycarbonate, considering the disposing of electrodes of the piezoelectric component.

The driver 130 can generate vibrations and be coupled to the vibrating plate 120. The driver 130 can include a piezoelectric component extended lengthwise. The driver 130 can be coupled to each vibrating bar 122 of the vibrating plate 120 described above.

Figure 5:
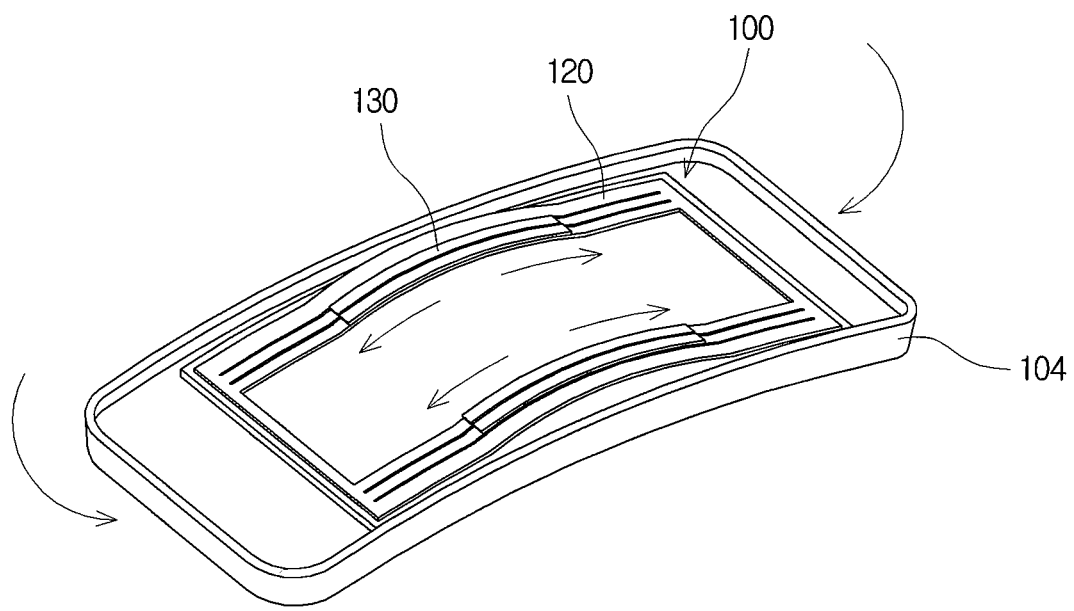
FIGS. 5 and 6 are perspective views illustrating how a touch interface assembly is operated in accordance with an embodiment of the present invention.
Figure 6:
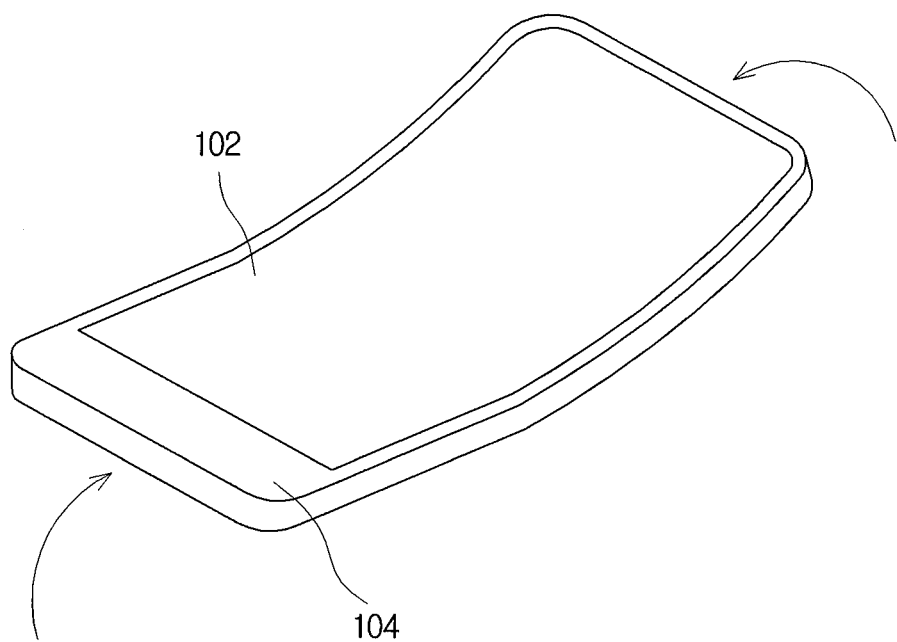

FIGS. 5 and 6 are perspective views illustrating how a touch interface assembly is operated in accordance with an embodiment of the present invention. As illustrated in FIGS. 5 and 6, if a voltage is supplied to a piezoelectric component, the piezoelectric component can be extended or contracted in a lengthwise direction, and thus both end parts of the display panel 112 can move vertically.

TABLE 1

| Simulation results of the range of displacement according to the material of vibrating plates | | | | |
|---|---|---|---|---|
| Material | Stainless steel | Brass | Aluminum | Polycarbonate |
| Young's modulus | 193 Gpa | 102 Gpa | 70 Gpa | 2.4 Gpa |
| Displacement | 2.12 | 2.21 | 2.28 | 2.33 |

Table 1 shows simulation results of the range of displacement according to the material of the vibrating plate 120. Here, the term "displacement" refers to the displacement of the center of the vibration actuator module 100 described above and is represented in units of micrometers.

Furthermore, Young's modulus represents the longitudinal-direction elastic modulus of each material and corresponds to the elastic modulus of each material.

As shown in Table 1, if the vibrating plate 120 made of polycarbonate, which has smaller Young's modulus than the frame 100 made of stainless steel, is used, the range of displacement can be increased by about 10%. This change is within a range that can be sensed by the user.

Accordingly, by improving the efficiency of transferring the vibrations of the driver 130 through the use of the vibrating plate 120, a smaller driver 130 can be used, and thus a thinner vibration actuator module 100 can be implemented.

Figure 7:
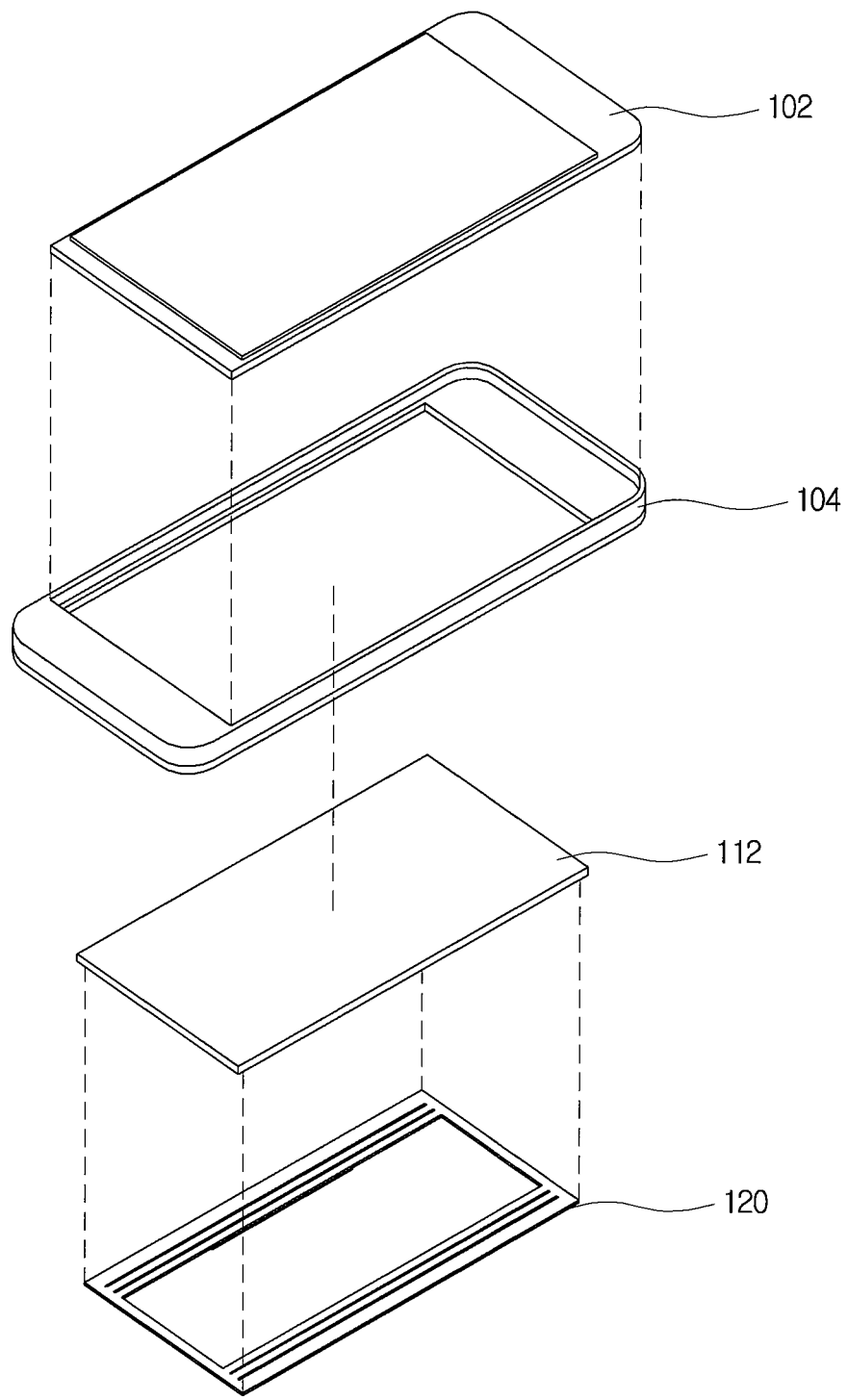
FIG. 7 is a perspective view of a touch interface assembly in accordance with another embodiment of the present invention.

FIG. 7 is a perspective view of a touch interface assembly in accordance with another embodiment of the present invention. As illustrated in FIG. 7, a touch interface assembly of the present embodiment can include a touchscreen panel, a case and a vibration actuator module.

Figure 8:
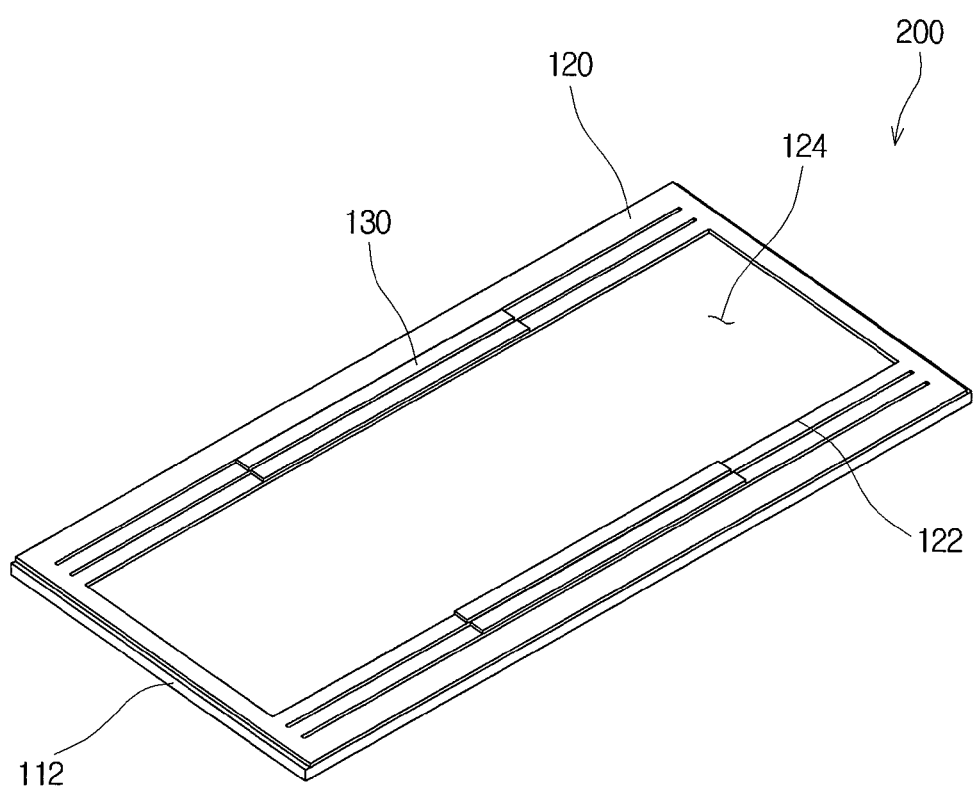
FIG. 8 is a perspective view of a vibration actuator module in accordance with another embodiment of the present invention.
Figure 9:
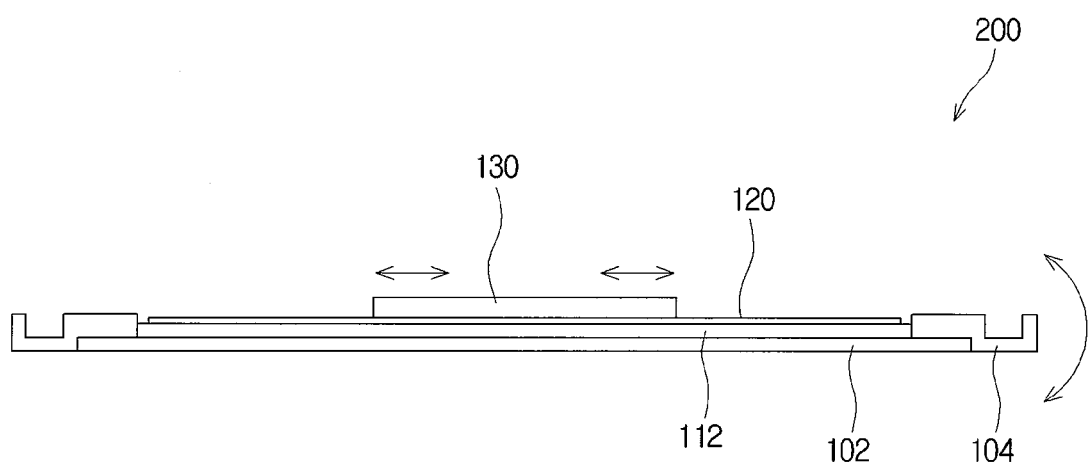
FIG. 9 is a cross-sectional view of a touch interface assembly in accordance with another embodiment of the present invention.

FIG. 8 is a perspective view of a vibration actuator module in accordance with another embodiment of the present invention, and FIG. 9 is a cross-sectional view of a touch interface assembly in accordance with another embodiment of the present invention.

As illustrated in FIGS. 8 and 9, a vibration actuator module 200 of the present embodiment can include the display panel 112, the vibrating plate 120 and the driver 130.

A vibrated body of the present embodiment can be the vibrated body of the previously described embodiment, but without the frame 110. For example, the vibrated body of the present embodiment can be the display panel 112. Here, a material having a smaller elastic modulus than the display panel 112 can be used for the vibrating plate 120.

The display panel 112 can be made of, for example, reinforced glass. This kind of display panel 112 can have a certain degree of structural rigidity in itself. In this case, the frame 110 for supporting and protecting the display panel 112 can be omitted.

Furthermore, the vibrating plate 120 coupled to a rear surface of the display panel 112 can be made of a material, for example, polycarbonate. Accordingly, since the vibrating plate 120 can be made of a material having a smaller elastic modulus than the display panel 112, which is the vibrated body, an effect that is identical or similar to that of the previously described embodiment can be expected.

By utilizing certain embodiments of the present invention as set forth above, the vibration efficiency of a vibration actuator module can be improved.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

What is claimed is:

1. A vibration actuator module, comprising:
   a vibrated body;
   a vibrating plate coupled to the vibrated body and having a smaller elastic modulus than the vibrated body; and
   a driver coupled to the vibrating plate, wherein:
   an opening is formed in a center of the vibrating plate,
   a vibrating bar is disposed on one of both sides of the opening, and
   the driver is coupled on the vibrating bar.

2. The vibration actuator module of claim 1, wherein the vibrated body is a display panel.

3. The vibration actuator module of claim 1, wherein the vibrated body comprises:
   a display panel; and
   a frame supporting the display panel.

4. The vibration actuator module of claim 3, wherein the frame comprises stainless steel.

5. The vibration actuator module of claim 4, wherein the vibrating plate comprises polycarbonate.

6. The vibration actuator module of claim 3, wherein the vibrating plate is interposed between the frame and the driver.

7. The vibration actuator module of claim 6, wherein the driver comprises a piezoelectric component configured to be extended and contracted in a lengthwise direction.

8. The vibration actuator module of claim 1, wherein the driver is disposed on the vibrating plate except for on the opening.

\* \* \* \* \*